(12) United States Patent
Jang et al.

(10) Patent No.: US 12,520,473 B2
(45) Date of Patent: Jan. 6, 2026

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei (CN)

(72) Inventors: Semyeong Jang, Hefei (CN); Joonsuk Moon, Hefei (CN); Deyuan Xiao, Hefei (CN); Minki Hong, Hefei (CN); Kyongtaek Lee, Hefei (CN); Jo-Lan Chin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 591 days.

(21) Appl. No.: 17/950,219

(22) Filed: Sep. 22, 2022

(65) Prior Publication Data

US 2023/0021074 A1   Jan. 19, 2023

Related U.S. Application Data

(63) Continuation of application No. PCT/CN2022/101192, filed on Jun. 24, 2022.

(30) Foreign Application Priority Data

Jun. 8, 2022   (CN) .......................... 202210644481.4

(51) Int. Cl.
*H10D 30/67* (2025.01)
*H10B 12/00* (2023.01)
(Continued)

(52) U.S. Cl.
CPC ......... *H10B 12/01* (2023.02); *H10D 30/6735* (2025.01); *H10D 62/102* (2025.01);
(Continued)

(58) Field of Classification Search
CPC ........ H10B 12/01; H10B 12/05; H10B 63/34; H10D 30/6735; H10D 62/102;
(Continued)

(56) References Cited

U.S. PATENT DOCUMENTS

| 5,244,824 A | 9/1993 | Sivan |
| 6,376,303 B1 | 4/2002 | Seo |

(Continued)

FOREIGN PATENT DOCUMENTS

| CN | 101017825 A | 8/2007 |
| CN | 101740500 A | 6/2010 |

(Continued)

*Primary Examiner* — Shahed Ahmed
(74) *Attorney, Agent, or Firm* — Syncoda LLC; Feng Ma

(57) ABSTRACT

A semiconductor structure and a method for manufacturing a semiconductor structure are provided. The semiconductor structure includes: a substrate, first gate structures, second gate structures, and a covering layer. The substrate includes semiconductor channels spaced apart from each other and arranged at a top portion of the substrate and extending in a vertical direction. Each first gate structure is arranged in a first area of a respective semiconductor channel and is arranged around the respective semiconductor channel. Each second gate structure is arranged in a second area of a respective semiconductor channel and includes a ring structure and at least one bridge structure. The covering layer is arranged in a spaced area between any two adjacent semiconductor channels. The covering layer includes first interconnecting holes extending in the vertical direction.

16 Claims, 11 Drawing Sheets

Semiconductor structure 80

(51) Int. Cl.
  *H10D 62/10* (2025.01)
  *H10D 64/01* (2025.01)
  *H10D 30/01* (2025.01)
  *H10D 30/43* (2025.01)

(52) U.S. Cl.
  CPC ........... *H10D 64/01* (2025.01); *H10D 64/017* (2025.01); *H10D 30/014* (2025.01); *H10D 30/43* (2025.01); *H10D 30/6757* (2025.01)

(58) Field of Classification Search
  CPC .... H10D 64/01; H10D 64/017; H10D 30/014; H10D 30/43; H10D 30/6757; H10D 1/716; H10D 30/025; H10D 30/611; H10D 30/63; H10D 62/117; H10D 84/016; H10D 84/0195; H10D 84/014–0142; H10D 30/023; H10D 84/0177
  See application file for complete search history.

(56) References Cited

U.S. PATENT DOCUMENTS

| | | |
|---|---|---|
| 9,673,257 B1 | 6/2017 | Takaki |
| 2006/0043471 A1 | 3/2006 | Tang |
| 2006/0046391 A1 | 3/2006 | Tang |
| 2007/0020819 A1 | 1/2007 | Tang |
| 2007/0048943 A1 | 3/2007 | Tang |
| 2007/0181925 A1 | 8/2007 | Yoon et al. |
| 2007/0224753 A1 | 9/2007 | Tang |
| 2009/0072291 A1 | 3/2009 | Takaishi |
| 2009/0207649 A1 | 8/2009 | Tang |
| 2010/0120221 A1 | 5/2010 | Kang |
| 2010/0213525 A1 | 8/2010 | Masuoka |
| 2011/0104862 A1 | 5/2011 | Kadoya |
| 2011/0121396 A1* | 5/2011 | Lee .................. G11C 11/403 257/E29.264 |
| 2011/0171796 A1 | 7/2011 | Tang |
| 2013/0011987 A1 | 1/2013 | Park |
| 2013/0056698 A1 | 3/2013 | Satoh |
| 2013/0075813 A1 | 3/2013 | Kadoya |
| 2015/0017767 A1 | 1/2015 | Masuoka et al. |
| 2015/0372135 A1* | 12/2015 | Park ..................... H10D 30/025 257/329 |
| 2015/0380548 A1 | 12/2015 | Wang et al. |
| 2016/0204251 A1 | 7/2016 | Masuoka et al. |
| 2017/0213836 A1* | 7/2017 | Zhang ................. H10D 12/211 |
| 2017/0271510 A1 | 9/2017 | Wang et al. |
| 2017/0309632 A1* | 10/2017 | Masuoka ............. H10D 84/038 |
| 2017/0323977 A1 | 11/2017 | Cheng et al. |
| 2018/0083136 A1 | 3/2018 | Xie et al. |
| 2018/0096896 A1 | 4/2018 | Zhu |
| 2018/0175212 A1 | 6/2018 | Cheng et al. |
| 2019/0027570 A1 | 1/2019 | Ching et al. |
| 2019/0115438 A1 | 4/2019 | Ching et al. |
| 2019/0123053 A1 | 4/2019 | Masuoka et al. |
| 2019/0237581 A1 | 8/2019 | Saito et al. |
| 2019/0326395 A1 | 10/2019 | Ando et al. |
| 2020/0020812 A1 | 1/2020 | Masuoka et al. |
| 2020/0052084 A1 | 2/2020 | Ching et al. |
| 2021/0305431 A1 | 9/2021 | Ishimaru et al. |
| 2022/0069070 A1 | 3/2022 | Lai et al. |
| 2022/0102347 A1 | 3/2022 | Lai et al. |
| 2022/0139918 A1 | 5/2022 | Lee |
| 2022/0139920 A1 | 5/2022 | Lee |
| 2022/0199837 A1 | 6/2022 | Masuoka et al. |
| 2022/0262954 A1 | 8/2022 | Ishimaru et al. |

FOREIGN PATENT DOCUMENTS

| | | |
|---|---|---|
| CN | 101933135 A | 12/2010 |
| CN | 102867752 A | 1/2013 |
| CN | 105280698 A | 1/2016 |
| CN | 106252352 A | 12/2016 |
| CN | 107845578 A | 3/2018 |
| CN | 110476230 A | 11/2019 |
| CN | 110931429 A | 3/2020 |
| CN | 113078155 A | 7/2021 |
| CN | 113078156 A | 7/2021 |
| CN | 113451405 A | 9/2021 |
| CN | 114464535 A | 5/2022 |
| CN | 114497039 A | 5/2022 |
| EP | 1804286 A1 | 7/2007 |
| WO | 2013033267 A1 | 3/2013 |

* cited by examiner

SEMICONDUCTOR STRUCTURE AND METHOD FOR MANUFACTURING SEMICONDUCTOR STRUCTURE

CROSS-REFERENCE TO RELATED APPLICATIONS

This is a continuation application of International Patent Application No. PCT/CN2022/101192, filed on Jun. 24, 2022, which claims priority to Chinese Patent Application No. 202210644481.4, filed on Jun. 8, 2022 and entitled "SEMICONDUCTOR STRUCTURE AND METHOD FOR MANUFACTURING SEMICONDUCTOR STRUCTURE". The disclosures of International Patent Application No. PCT/CN2022/101192 and Chinese Patent Application No. 202210644481.4 are incorporated by reference herein in their entireties.

BACKGROUND

As the integration density of a dynamic memory develops to be higher, it is necessary to improve the electrical performance of the functional device with a small size while the arrangement of transistors in a dynamic memory array structure and the method for reducing the size of a single functional device in the dynamic memory array structure are studied.

Higher density efficiency may be achieved when a Vertical Gate All Around (VGAA) transistor structure is used as an access transistor of the dynamic memory. However, in the related art, the performance of a semiconductor structure related to the access transistor is relatively low.

SUMMARY

The present disclosure relates, but is not limited, to a semiconductor structure and a method for manufacturing a semiconductor structure.

In view of this, embodiments of the present disclosure provide a semiconductor structure and a method for manufacturing a semiconductor structure, which may improve the overall electrical performance of the semiconductor structure.

The technical solutions of the embodiments of the present disclosure are implemented as follows.

An embodiment of the present disclosure provides a semiconductor structure, which includes:
  a substrate, in which the substrate includes a plurality of semiconductor channels spaced apart from each other, the plurality of semiconductor channels are arranged at a top portion of the substrate and extend in a vertical direction, and each of the plurality of semiconductor channels includes a first area and a second area;
  a plurality of first gate structures, in which each of the plurality of first gate structures is arranged in the first area of a respective one of the plurality of semiconductor channels and is arranged around the respective one of the plurality of semiconductor channels;
  a plurality of second gate structures, in which each of the plurality of second gate structures is arranged in the second area of a respective one of the plurality of semiconductor channels and includes a ring structure and at least one bridge structure, in which the ring structure is arranged around the respective one of the plurality of semiconductor channels, and the at least one bridge structure penetrates through the respective one of the plurality of semiconductor channels and extends to an inner wall of the ring structure in a penetrating direction; and
  a covering layer arranged in a spaced area between any two adjacent semiconductor channels of the plurality of semiconductor channels and including a plurality of first interconnecting holes extending in the vertical direction, in which each of the plurality of first interconnecting holes exposes a top portion of a respective one of the plurality of semiconductor channels and a portion of a sidewall of the respective one of the plurality of semiconductor channels close to the top portion of the respective one of the plurality of semiconductor channels.

An embodiment of the disclosure also provides a method for manufacturing a semiconductor structure, which includes the following operations. A substrate is provided, in which the substrate includes a plurality of semiconductor channels spaced apart from each other, the plurality of semiconductor channels are arranged at a top portion of the substrate and extend in a vertical direction, and each of the plurality of semiconductor channels includes a first area and a second area. A first gate structure is formed in the first area of each of the plurality of semiconductor channels, in which the first gate structure is arranged around a respective one of the plurality of semiconductor channels. A second gate structure is formed in the second area of each of the plurality of semiconductor channels, in which the second gate structure includes a ring structure and at least one bridge structure, in which the ring structure is arranged around a respective one of the plurality of semiconductor channels, and the at least one bridge structure penetrates through the respective one of the plurality of semiconductor channels and extends to an inner wall of the ring structure in a penetrating direction. A covering layer is formed, in which the covering layer is arranged in a spaced area between any two adjacent semiconductor channels of the plurality of semiconductor channels, and includes a plurality of first interconnecting holes extending in the vertical direction, in which each of the plurality of first interconnecting holes exposes a top portion of a respective one of the plurality of semiconductor channels and a portion of a sidewall of the respective one of the plurality of semiconductor channels close to the top portion of the respective one of the plurality of semiconductor channels.

DETAILED DESCRIPTION

In order to make the objectives, technical solutions and advantages of the present disclosure clearer, the technical solutions of the present disclosure are further described in details below in combination with the accompanying drawings and the embodiments. The described embodiments should not be regarded as limitations of the present disclosure. All other embodiments obtained by those of ordinary skill in the art without creative efforts shall fall within the protection scope of the present disclosure.

In the following description, the expression "some embodiments" is involved, which describe a subset of all possible embodiments. However, it should be understood that, "some embodiments" may be same subsets or a different subsets of all possible embodiments, and may be combined with each other without conflict.

If a similar description of "first/second" appears in the application document, the following description will be added. In the following description, the involved terms "first/second/third" may only be used to distinguish similar objects, without indicating any specific ordering for objects. Understandably, "first/second/third" may be exchanged in a specific order or sequence where it is permitted, so that the embodiments of the present disclosure described herein may be implemented in an order other than those illustrated or described herein.

Unless defined otherwise, all technical and scientific terms used herein have the same meaning as commonly understood by those skilled in the art to which the present disclosure belongs. The terminology used herein is for a purpose of describing the embodiments of the present disclosure and is not intended to limit the present disclosure.

Figure 1:
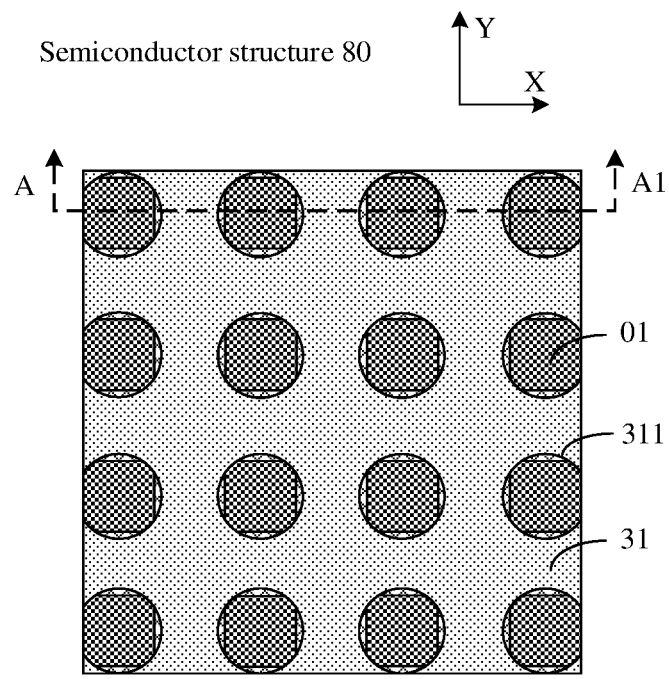
FIG. 1 is a first schematic diagram of a semiconductor structure according to an embodiment of the present disclosure.
Figure 2:
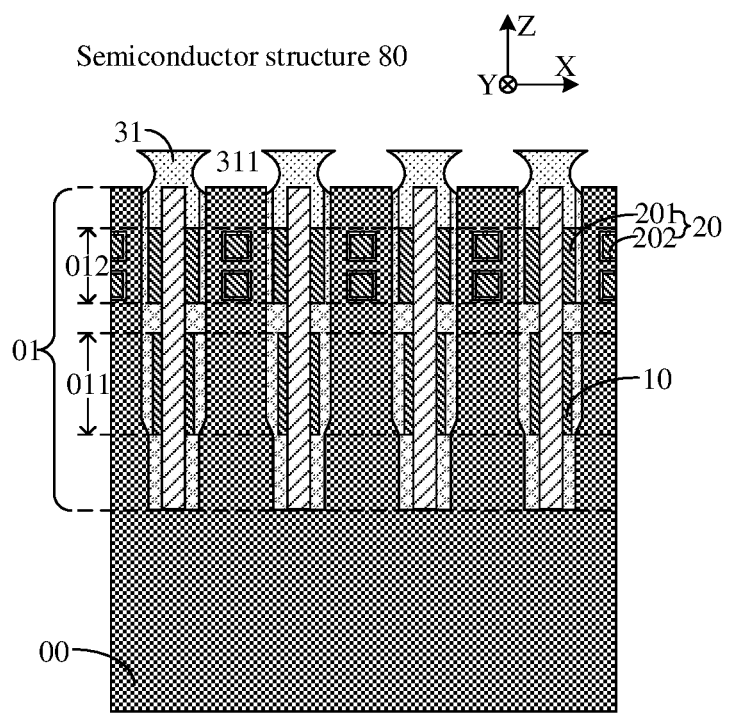
FIG. 2 is a second schematic diagram of a semiconductor structure according to an embodiment of the present disclosure.

FIG. 1 and FIG. 2 are optional schematic diagrams of a semiconductor structure according to an embodiment of the present disclosure. FIG. 1 is a top view, and FIG. 2 is a cross-sectional view taken along a cross-sectional line A-A1 in FIG. 1.

With reference to FIG. 1 and FIG. 2, the semiconductor structure 80 includes a substrate 00, a plurality of first gate structures 10, a plurality of second gate structures 20, and a covering layer 31.

The substrate 00 includes a plurality of semiconductor channels 01 spaced apart from each other. The plurality of semiconductor channels 01 are arranged at a top portion of the substrate 00 and extend in a vertical direction Z. Each semiconductor channel 01 includes a first area 011 and a second area 012.

Each first gate structure 10 is arranged in the first area 011 of a respective one of the plurality of semiconductor channels 01 and is arranged around the respective one of the plurality of semiconductor channels 01.

Each second gate structure 20 is arranged in the second area 012 of a respective one of the plurality of semiconductor channels 01 and includes a ring structure 201 and at least one bridge structure 202. The ring structure 201 is arranged around the respective one of the plurality of semiconductor channels 01, and the at least one bridge structure 202 penetrates through the respective one of the plurality of semiconductor channels 01 and extends to an inner wall of the ring structure 201 in a penetrating direction.

The covering layer 31 is arranged in a spaced area between any two adjacent semiconductor channels 01. The covering layer 31 includes a plurality of first interconnecting holes 311 extending in the vertical direction Z. Each first interconnecting hole 311 exposes a top portion of a respective one of the plurality of semiconductor channels 01 and a portion of a sidewall of the respective one of the plurality of semiconductor channels close to the top portion of the respective one of the plurality of semiconductor channels.

It should be noted that a first direction X and a second direction Y shown in FIG. 1 are both perpendicular to the vertical direction Z shown in FIG. 2. The first direction X and the second direction Y may be perpendicular to each other, and may also be at any angle. Hereinafter, an exemplary description is given by taking the first direction X being perpendicular to the second direction Y as an example.

In the embodiments of the present disclosure, the substrate 00 may contain at least one of semiconductor materials, for example, group IV elements such as silicon (Si), germanium (Ge), and silicon germanium (SiGe), or group III-V components such as gallium arsenide (GaAs), aluminum gallium arsenide (AlGaAs), indium arsenide (InAs), or indium gallium arsenide (InGaAs). Hereinafter, an exemplary description is given by taking the substrate 00 containing silicon element as an example.

The semiconductor channel 01 may have doping elements to improve the conductivity of the semiconductor channel 01. The doping element may be a P-type doping element or an N-type doping element. The N-type doping element may be at least one of arsenic (As) element, phosphorus (P)

element, or antimony (Sb) element. The P-type doping element may be at least one of boron (B) element, indium (In) element, or gallium (Ga) element.

The material of each of the first gate structure 10 and the second gate structure 20 may be titanium nitride (TiN), or may be at least one of conductive materials, such as tantalum nitride (TaN), copper (Cu), or tungsten (W). Hereinafter, an exemplary description is given by taking titanium nitride as an example.

In the embodiments of the present disclosure, the first interconnecting holes 311 are formed on the covering layer 31. In the subsequent process, a lower electrode plate of a capacitor may be formed in the first interconnecting hole 311, and is electrically connected to the semiconductor channel 01. With reference to FIG. 1 and FIG. 2, the first interconnecting hole 311 may expose the top portion of the respective semiconductor channel 01 and a portion of the sidewall of the respective semiconductor channel close to the top portion of the respective semiconductor channel. In this way, the contact area between the semiconductor channel 01 and the capacitor subsequently formed is enlarged, thereby reducing the contact resistance and improving the electrical performance.

In some embodiments of the present disclosure, with reference to FIG. 2, an aperture of a middle portion of each of the plurality of first interconnecting holes 311 is larger than an aperture of a top portion or a bottom portion of each first interconnecting hole. It should be noted that the middle portion of the first interconnecting hole 311 refers to an area between the top portion and the bottom portion of the first interconnecting hole. The lower electrode plate of the capacitor may be formed in the first interconnecting hole 311, the aperture of the top portion or the bottom portion of the first interconnecting hole is too large to easily protect the capacitor, so that the risk of short circuit is high. Therefore, the aperture of the top portion or the bottom portion of the first interconnecting hole 311 should not be too large. Then, the aperture of the middle portion of the first interconnecting hole 311 is increased, so that the aperture of the middle portion is larger than the aperture of the top portion or the bottom portion of the first interconnecting hole. In this way, on the one hand, the risk of short circuit is not increased, and on the other hand, it is beneficial to enlarge the surface area of the electrode plate of the capacitor, so that the capacitance is improved.

In some embodiments of the present disclosure, as shown in FIG. 2, a top portion of the covering layer 31 is higher than the top portion of each semiconductor channel 01. It can be understood that, the top portion of the covering layer 31 is higher than the top portion of the semiconductor channel 01, so that the electrode plates of the capacitors formed in the first interconnecting holes 311 may be isolated from each other, so as to prevent short circuit from occurring.

In some embodiments of the present disclosure, the material of the covering layer 31 shown in FIG. 1 and FIG. 2 may be boron silicon nitride ($SiB_xN_y$), where a ratio of x to y represents a ratio of the number of boron atoms to the number of nitrogen atoms in the boron silicon nitride, and $4 \geq y > x > 0$, $y-x \leq 2$. It should be noted that the representation of $SiB_xN_y$ does not mean that the number of the silicon atoms is 1. Compared with the general materials, the etching rate of the boron silicon nitride is higher, that is, the boron silicon nitride is easier to be etched. Therefore, the covering layer 31 made of the boron silicon nitride is adopted, so that it is easier to form the first interconnecting hole 311 with a larger aperture of the middle portion of the first interconnecting hole, so that the surface area of the electrode plate of the capacitor may be enlarged, thereby improving the capacitance.

In the embodiments of the present disclosure, when the silicon nitride is formed, the boron element may be introduced into the cavity, thereby forming the boron silicon nitride. Meanwhile, by controlling a flow ratio of the nitrogen atoms to the boron atoms, the ratio of the number of the boron atoms to the number of the nitrogen atoms in the boron silicon nitride may be adjusted. It should be noted that, since the boron silicon nitride is easier to be etched than the silicon nitride, and the boron atoms are doped into the silicon nitride at the same time, so that the stress of the silicon nitride may be reduced. That is, the stress of the boron silicon nitride is smaller, and the internal interaction force of the boron silicon nitride is smaller, so that the structural damage is not prone to generation, thereby improving the performance of the device. In a case that the difference between the number of the nitrogen atoms and the number of the boron atoms is smaller than or equal to 2, the content of the nitrogen atoms in the boron silicon nitride may be increased, so that the etching rate of the boron silicon nitride can be increased, and the stress of the boron silicon nitride is smaller. In a case that the difference between the number of the nitrogen atoms and the number of the boron atoms is greater than 2, the content of the boron atoms in the boron silicon nitride is lower, so that the etching rate of the boron silicon nitride is lower, and the stress of the boron silicon nitride is larger.

In some embodiments of the present disclosure, the boron silicon nitride $SiB_xN_y$ is $SiB_2N_4$ or $SiB_{2.6}N_4$. It should be noted that the representation of $SiB_xN_y$ does not mean that the number of the silicon atoms is 1.

In some embodiments of the present disclosure, as shown in FIG. 2, the second area 012 is arranged above the first area 011. A top portion of the ring structure 201 is lower than a top portion of the respective semiconductor channel 01, and the top portion of the ring structure 201 is covered with the covering layer 31. It can be understood that, the top portion of the ring structure 201 is lower than the top portion of the semiconductor channel 01, that is, the top portion of the semiconductor channel 01 is not covered with the ring structure 201. In this way, when the first interconnecting hole is formed at the top portion of the semiconductor channel 01, the formed insulating covering layer may protect the ring structure 201. Meanwhile, the contact area between the capacitor and the semiconductor channel 01 is enlarged, thereby reducing the contact resistance. In addition, the top portion of the ring structure 201 is covered with the covering layer 31, so that the covering layer 31 protects the ring structure 201, thereby preventing short circuit from occurring. In some embodiments, the position of the second area 012 and the position of the first area 011 may also be interchanged with each other.

Figure 3:
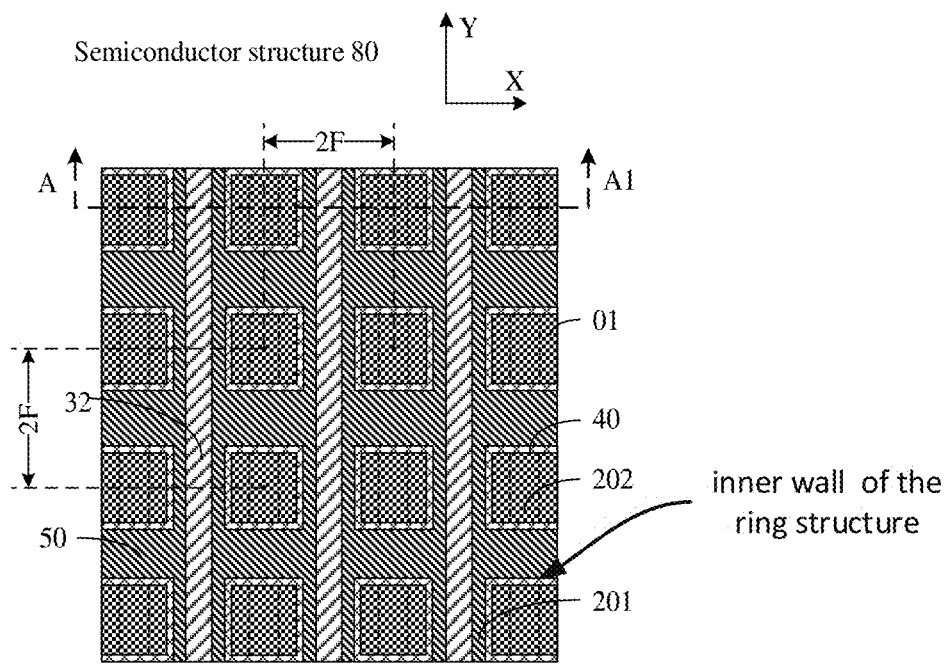
FIG. 3 is a third schematic diagram of a semiconductor structure according to an embodiment of the present disclosure.
Figure 4:
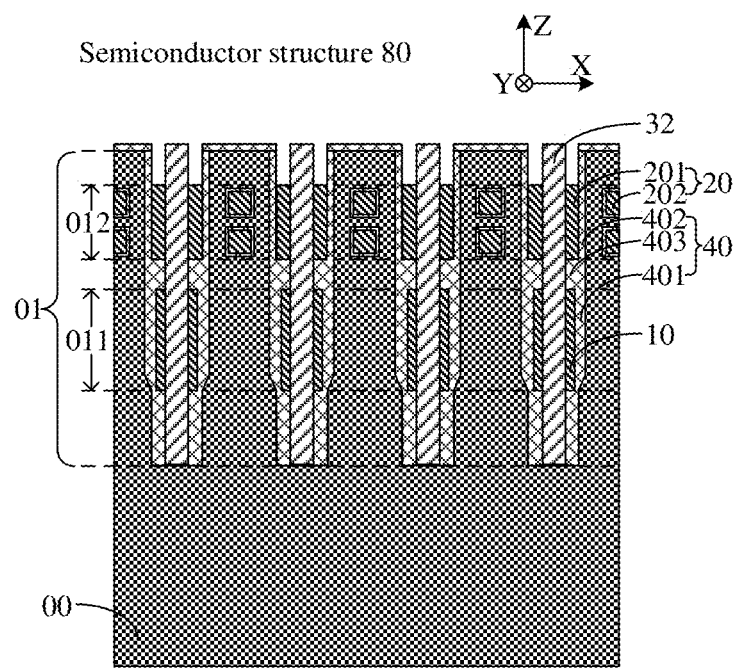
FIG. 4 is a fourth schematic diagram of a semiconductor structure according to an embodiment of the present disclosure.

FIG. 3 and FIG. 4 illustrate some structures arranged below the covering layer in the semiconductor structure. FIG. 3 is a top view, and FIG. 4 is a cross-sectional view taken along a cross-sectional line A-A1 in FIG. 3.

In some embodiments of the present disclosure, as shown in FIG. 3 and FIG. 4, the semiconductor structure 80 further includes a plurality of dielectric layers 40. Each dielectric layer 40 includes a first portion 401, a second portion 402 and a third portion 403. The first portion 401 of each dielectric layer 40 is arranged between a respective one of the plurality of first gate structures 10 and a respective one of the plurality of semiconductor channels 01. The second portion 402 of each dielectric layer 40 is arranged between a respective one of the plurality of second gate structures 20 and a respective one of the plurality of semiconductor channels 01. The third portion 403 of each dielectric layer 40 is arranged between the first portion 401 of a respective one of the plurality of dielectric layers 40 and the second portion 402 of the respective one of the plurality of dielectric layers 40. The material of the dielectric layer 40 may be silicon oxide (SiO).

In the embodiments of the present disclosure, the semiconductor channel 01, the first gate structure 10 and the first portion 401 of the dielectric layer 40 collectively forms a first transistor, and the semiconductor channel 01, the second gate structure 20 and the second portion 402 of the dielectric layer 40 collectively forms a second transistor. The first area 011 and the second area 012 of the semiconductor channel 01 respectively form the trenches, and other areas of the semiconductor channel 01 respectively form the source or the drain. The first gate structure 10 is configured as a gate of the first transistor, and the second gate structure 20 is configured as a gate of the second transistor. The first portion 401 of the dielectric layer 40 is configured as a gate dielectric of the first transistor, and the second portion 402 of the dielectric layer 40 is configured as a gate dielectric of the second transistor, while the third portion 403 of the dielectric layer 40 isolates the gate of the first transistor from the gate of the second transistor, so as to preventing short circuit from occurring.

The first transistor and the second transistor are both VGAA transistors. That is, the trench formed by the semiconductor channel 01 extends in the vertical direction Z, and the first gate structure 10 and the ring structure 201 of the second gate structure 20 are both arranged around the trench. Therefore, with the same size, compared with the transistor structures such as a Fin Field-Effect Transistor (FinFET), the gates of the first transistor and the second transistor may more sufficiently cover the trench, so that the control capability of the gate is stronger.

In the embodiments of the present disclosure, with reference to FIG. 3, in a top view, the size of the semiconductor channel 01 satisfies $4F^2$ (F: the minimum pattern size obtainable under the given process conditions). That is, the distance between the center points of two adjacent semiconductor channels 01 in the first direction X is 2F, and the distance between the center points of two adjacent semiconductor channels 01 in the second direction Y is also 2F. Therefore, the integration density of the semiconductor structure 80 is improved. In some embodiments, when a memory cell is formed on the semiconductor channel 01, the memory cell may also be arranged in $4F^2$.

In the embodiments of the present disclosure, with reference to FIG. 3 and FIG. 4, the bridge structure 202 of the second gate structure 20 penetrates through the semiconductor channel 01, and extends to the inner wall of the ring structure 201 in the penetrating direction (i.e. the second direction Y). Thus, the semiconductor channel 01 is penetrated to form a through hole. The through hole is filled with the bridge structure 202, that is, an inner wall of the through hole is covered with the bridge structure 202. In this way, the bridge structure 202 covers a portion of the trench, so that the area of the trench covered by the second gate structure 20 is enlarged, and the trench is more easily controlled, thereby further improving the control capability of the gate of the second transistor.

It can be understood that, the semiconductor channel 01 and the first gate structure 10 may form the first transistor, and the semiconductor channel 01 and the second gate structure 20 may form the second transistor. The first transistor and the second transistor may be configured as access transistors. That is, the gate of the first transistor and the gate of the second transistor may both receive a control signal, and the control capability of the gates of these two transistors on the semiconductor channel 01 may complement each other. For example, if the gate of one of these two transistors fails to completely turn off the semiconductor channel 01, the gate of the other transistor may complement, so that the semiconductor channel 01 may be turned off, thereby reducing the leakage current in the semiconductor channel 01, and improving the overall electrical performance of the semiconductor structure 80.

Meanwhile, the second gate structure 20 includes the ring structure 201 arranged around the semiconductor channel 01 and the bridge structure 202 penetrating through the semiconductor channel 01. The area of the semiconductor channel 01 covered by the second gate structure 20 is enlarged, so that the control capability of the gate of the second transistor on the semiconductor channel 01 is improved, thereby improving the overall electrical performance of the semiconductor structure 80.

In some embodiments of the present disclosure, as shown in FIG. 4, a thickness of the third portion 403 of each dielectric layer 40 is greater than a thickness of the first portion 401 of each dielectric layer 40, and the thickness of the first portion 401 of each dielectric layer 40 is greater than a thickness of the second portion 402 of each dielectric layer 40. Correspondingly, a thickness of the ring structure 201 in the second area 012 is greater than a thickness of the first gate structure 10 in the first area 011. The above-mentioned thickness may be the thickness in the first direction X.

It can be understood that, the second portion 402 of the dielectric layer 40 in the second area 012 may be set to be thinner, which is beneficial to reduce the threshold voltage of the gate of the second transistor, thereby further improving the control capability of the gate of the second transistor. Correspondingly, the ring structure arranged around the sidewall of the second portion 402 of the dielectric layer 40 may be set to be thicker, which is beneficial to reduce the resistance of the ring structure 201 and reduce the voltage loss of the gate of the second transistor, thereby further improving the control capability of the gate of the second transistor. Meanwhile, the first gate structure 10 is set to be thinner, and the area of the first gate structure facing the ring structure 201 is smaller, that is, the area of the electrode plate of a parasitic capacitance between the first gate structure 10 and the ring structure 201 is smaller, so that the parasitic capacitance between the first gate structure 10 and the ring structure 201 is reduced.

In some embodiments of the present disclosure, as shown in FIG. 4, a length of the first gate structure 10 in the vertical direction Z is greater than a length of the ring structure 201 in the vertical direction Z.

It can be understood that, on the one hand, the length of the first gate structure 10 in the vertical direction Z may be set to be longer. In this way, the area of the trench covered by the first gate structure 10 is enlarged, thereby further improving the control capability of the gate of the first transistor. On the other hand, the second gate structure 20 may contain a zirconium element and/or at least one of lanthanide elements, which is beneficial to improve the electrical performance of the second gate structure 20, thereby improving the control capability of the second gate structure 20 on the semiconductor channel 01. In a case that the length of the second gate structure 20 is smaller than the length of the first gate structure 10, the conductivity of the second gate structure 20 is improved by doping the zirconium element and/or at least one of the lanthanide elements into the second gate structure 20, so that the difference in conductivity between the first gate structure 10 and the second gate structure 20 due to the size difference may be complemented, so that the difference in the control capability of the first gate structure 10 and the second gate structure 20 on the semiconductor channel 01 is reduced, thereby improving the overall stability of the semiconductor structure 80.

In some embodiments of the present disclosure, as shown in FIG. 4, each second gate structure 20 includes at least two bridge structures 202. The at least two bridge structures 202 are stacked on one another in the vertical direction Z. It can be understood that, each bridge structure 202 covers the inner wall of one through hole on the semiconductor channel 01, that is, each bridge structure covers a portion of the trench. Thus, the coverage area of the trench may be enlarged by adopting at least two bridge structures 202, thereby further improving the control capability of the gate of the second transistor.

In some embodiments of the present disclosure, as shown in FIG. 4, the width of each bridge structure 202 is smaller than the width of the semiconductor channel 01. The semiconductor channel 01 is penetrated by the bridge structure 202, and the bridge structure 202 covers the inner wall of the through hole, so that the contact area between the second gate structure 20 and the semiconductor channel 01 is enlarged, and the length of the trench corresponding to the second gate structure 20 is also increased. Therefore, the control capability of the second gate structure 20 on the semiconductor channel 01 is improved, and the contact resistance between the second gate structure 20 and the semiconductor channel 01 is reduced.

In some embodiments of the present disclosure, as shown in FIG. 3 and FIG. 4, the semiconductor structure 80 further includes a first isolation layer 32. The first isolation layer 32 is arranged between two adjacent semiconductor channels 01, and each of the first gate structure 10 and the second gate structure 20 is arranged between the first isolation layer 32 and the respective semiconductor channel 01.

In the embodiments of the present disclosure, the first isolation layer 32 extends in the second direction Y to isolate two adjacent semiconductor channels 01 from each other. In addition, the first gate structures 10 arranged in the second direction Y are connected in series by a word line 50 extending in the second direction Y, and the second gate structures 20 arranged in the second direction Y are connected in series by the word line 50 extending in the second direction Y. The first gate structures 10 are connected in series by a first portion of the word line 50, the second gate structures 20 are connected in series by a second portion of the word line 50 (not shown in FIG. 3 due to the shading relationship), and the first isolation layer 32 is also configured to isolate the adjacent word lines 50 from each other. The material of the first isolation layer 32 may be silicon nitride (SiN).

It can be understood that, since the first gate structures 10 and the second gate structures 20 are respectively connected in series by the two portions of the word line 50, these two portions of the word line 50 jointly transmit the signal on the word line, that is, the word line 50 simultaneously contacts the semiconductor channel 01 through the first gate structures 10 and the second gate structures 20. In this way, the contact area between the word line 50 and the semiconductor channel 01 is enlarged, and the contact resistance between the word line 50 and the semiconductor channel 01 is reduced, thereby improving the electrical stability of the word line 50, and improving the control capability of the word line 50 on the first transistor and the second transistor.

Figure 5:
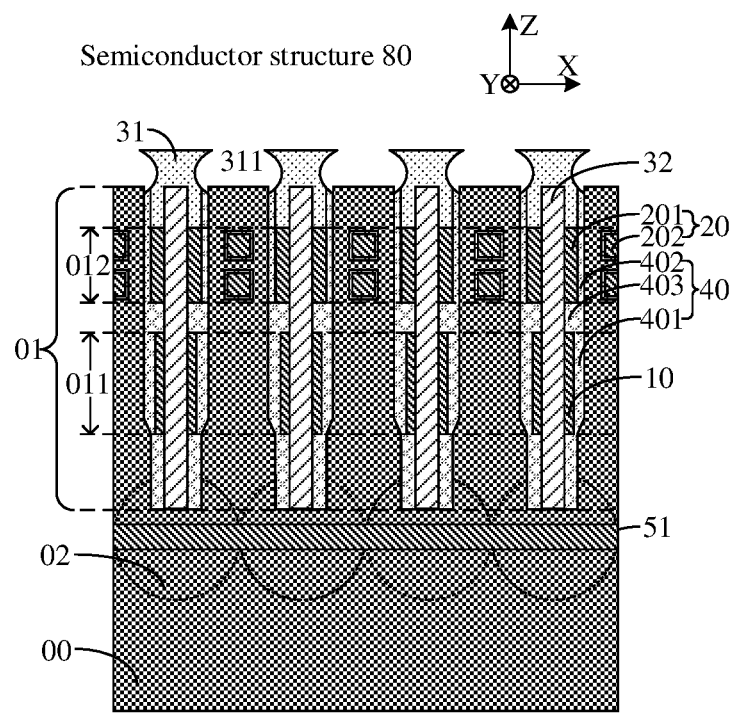
FIG. 5 is a fifth schematic diagram of a semiconductor structure according to an embodiment of the present disclosure.

In some embodiments of the present disclosure, as shown in FIG. 5, the semiconductor structure 80 further includes a bit line 51. The bit line 51 is arranged within the substrate 00, and is electrically connected to the bottom portion of the semiconductor channel 01.

In the embodiments of the present disclosure, with reference to FIG. 3 and FIG. 4, the bit line 51 extends in the first direction X. The substrate 00 may further include a plurality of metal silicide structures 02 (an area surrounded by a circular dotted line). The metal silicide structures 02 are connected to each other, so as to form the bit line 51 electrically connected to the bottom portion of the semiconductor channel 01.

In the embodiments of the present disclosure, the material of the metal silicide structure 02 contains at least one of cobalt silicide, nickel silicide, molybdenum silicide, titanium silicide, tungsten silicide, tantalum silicide, or platinum silicide.

It can be understood that, compared with the unmetallized semiconductor material, the metal silicide structure 02 has a relatively small resistivity, which is beneficial to reduce the resistance of the bit line 51 and reduce the contact resistance between the bit line 51 and the semiconductor channel 01, thereby further improving the electrical performance of the semiconductor structure 80.

In the embodiments of the present disclosure, as shown in FIG. 3 and FIG. 4, the bottom portion of the semiconductor channel 01 is configured as the source or the drain of the first transistor, and may be electrically connected to the bit line 51. The first gate structures 10 are configured as the gates of the first transistor, and may be connected in series by the word line 50. The second gate structures 20 are configured as the gates of the second transistor, and may be connected in series by the word line 50. The top portion of the semiconductor channel 01 is configured as the source or the drain of the second transistor, and may be electrically connected to a subsequently formed capacitor structure.

Figure 6:
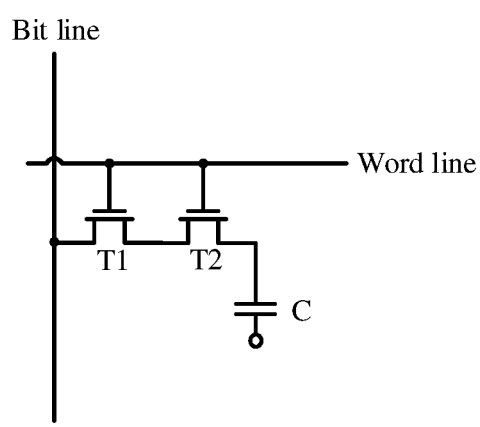
FIG. 6 is a sixth schematic diagram of a semiconductor structure according to an embodiment of the present disclosure.

Thus, the semiconductor structure 80 may form a circuit as shown in FIG. 6. The source or the drain of the first transistor T1 is connected to the bit line, the drain or the source of the second transistor T2 is connected to a capacitor C, and the gates of the first transistor T1 and the second transistor T2 are both connected to the word line. In this way, a circuit structure of 2T-1C (i.e., the circuit structure with two transistors and one capacitor) is formed, which may be used in the memory cell of a memory, such as a Dynamic Random Access Memory (DRAM). In this circuit structure of 2T-1C, the word line simultaneously contacts the semiconductor channel through the gate of the first transistor T1 and the gate of the second transistor T2, so that the contact area between the word line and the semiconductor channel is larger, and the contact resistance is smaller. Therefore, the electrical stability is higher, the control capability of the word line on the first transistor T1 and the second transistor T2 is better, thereby reducing the leakage of the transistors. For example, if the source and the drain of one of the transistors are not completely turned off, the other transistor may complement it, so as to avoid leakage current between the bit line and the capacitor C.

Figure 7:
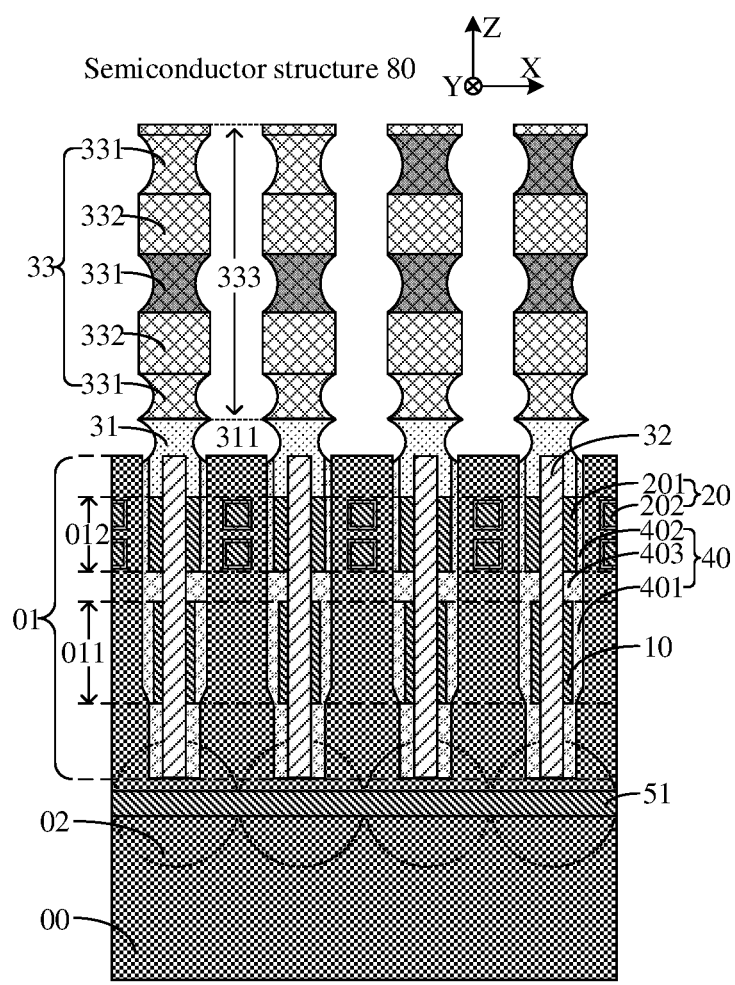
FIG. 7 is a seventh schematic diagram of a semiconductor structure according to an embodiment of the present disclosure.

In some embodiments of the present disclosure, as shown in FIG. 7, the semiconductor structure 80 further includes a plurality of sacrificial structures 33 arranged above the covering layer 31. Each sacrificial structure 33 includes additional doping areas 331 and body areas 332. The additional doping areas 331 and the body areas 332 are alternately arranged in the vertical direction Z. The doping concentration in the additional doping area 331 is higher than the doping concentration in the body area 332. For example, if the material of the sacrificial structure 33 is BoroPhosphorous Silicon Glass (BPSG) doped with the boron elements, the boron content in the additional doping area 331 is higher than the boron content in the body area 332. Of course, in some embodiments, the body area 332 may also be undoped BPSG.

In the embodiments of the present disclosure, the sacrificial structure 33 may be doped through an Ion Implantation Process (IMP) to form the additional doping areas 331. The ion implantation is controlled by adopting different energies, so that areas with different depths in the sacrificial structure 33 may be doped, thereby forming the additional doping areas 331 and body areas 332 alternately arranged.

In some embodiments of the present disclosure, as shown in FIG. 7, the sacrificial structure 33 may be machined to form a capacitor hole 333. In the subsequent process, the capacitor may be formed in the capacitor hole 333, and the capacitor is electrically connected to the semiconductor channel 01.

In the embodiments of the present disclosure, the capacitor hole 333 is formed by etching according to the mask. Since the doping concentration of the boron in the additional doping area 331 is higher than the doping concentration of boron in the body area 332, the additional doping area 331 is easier to be etched than the body area 332, and the additional doping area 331 is easier to form an isotropic etching structure. With reference to FIG. 7, the aperture of the capacitor hole 333 in the additional doping area 331 is larger than that in the body area 332, so that the cross-sectional profile of the inner sidewall of the capacitor hole 333 is wavy.

It can be understood that, since the electrode plate of the capacitor formed in the capacitor hole 333 covers the inner sidewall of the capacitor hole 333, the inner sidewall of the capacitor hole 333 with the wavy cross-sectional profile may increase the area of the electrode plate of the capacitor, thereby increasing the capacity of the capacitor. Meanwhile, the first interconnecting hole 311 may expose the top portion of the semiconductor channel 01 and a portion of the sidewall of the semiconductor channel close to the top portion of the semiconductor channel, so that the contact area between the semiconductor channel 01 and the capacitor is enlarged, thereby reducing the contact resistance and improving the electrical performance.

An embodiment of the present disclosure further provides a method for manufacturing a semiconductor structure, which includes S101 to S105. Hereinafter, which may be described in combination with various operations.

It should be noted that, FIG. 8 to FIG. 20 are partial structural diagrams of a semiconductor structure in various operations, which are used to describe and clearly illustrate the operations in the method for manufacturing the semiconductor structure. A first direction X and a second direction Y shown in FIG. 8 to FIG. 20 are both perpendicular to the vertical direction Z. The first direction X and the second direction Y may be perpendicular to each other, and may also be at any angle. Hereinafter, an exemplary description is given by taking the first direction X being perpendicular to the second direction Y as an example.

Figure 8:
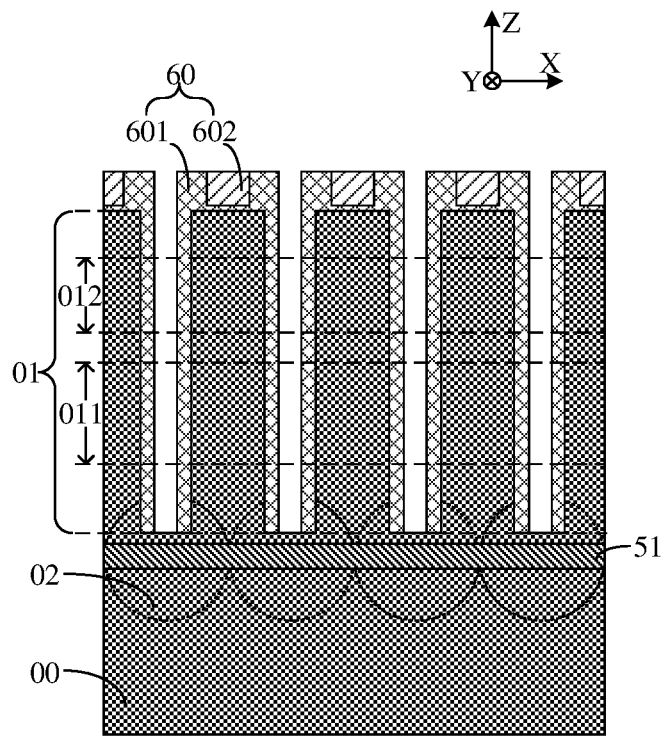
FIG. 8 is a first schematic diagram of a method for manufacturing a semiconductor structure according to an embodiment of the present disclosure.

In S101, a substrate is provided. As shown in FIG. 8, the substrate 00 includes a plurality of semiconductor channels 01 spaced apart from each other. The plurality of semiconductor channels 01 are arranged at a top portion of the substrate 00 and extend in a vertical direction Z. Each of the plurality of semiconductor channels 01 includes a first area 011 and a second area 012.

In the embodiments of the present disclosure, the substrate 00 may include at least one of semiconductor materials, for example, group IV elements such as silicon (Si), germanium (Ge), and silicon germanium (SiGe), or group III-V components such as gallium arsenide (GaAs), aluminum gallium arsenide (AlGaAs), indium arsenide (InAs), or indium gallium arsenide (InGaAs). Hereinafter, an exemplary description is given by taking the substrate 00 containing silicon element as an example.

The semiconductor channel 01 may have doping elements to improve the conductivity of the semiconductor channel 01. The doping element may be a P-type doping element or an N-type doping element. The N-type doping element may be at least one of arsenic (As) element, phosphorus (P) element, or antimony (Sb) element. The P-type doping element may be at least one of boron (B) element, indium (In) element, or gallium (Ga) element.

In the embodiments of the present disclosure, with reference to FIG. 8, the substrate 00 is further provided with a bit line 51, and the bit line 51 extends in the first direction X. The substrate 00 further includes a plurality of metal silicide structures 02 (an area surrounded by a circular dotted line). The metal silicide structures 02 are connected to each other, so as to form the bit line 51. The bottom portion of the semiconductor channel 01 is electrically connected to the bit line 51. The material of the metal silicide structure 02 contains at least one of cobalt silicide, nickel silicide, molybdenum silicide, titanium silicide, tungsten silicide, tantalum silicide, or platinum silicide.

With reference to FIG. 8, the semiconductor channel 01 is also covered with a mask layer 60. A first portion 601 of the mask layer 60 covers the sidewall and the top portion of the semiconductor channel 01, and the middle portion of the first portion 601 is filled with a second portion 602 of the mask layer 60. The material of the first portion 601 of the mask layer 60 is different from the material of the second portion 602 of the mask layer 60. For example, the material of the first portion 601 is silicon oxide, and the material of the second portion 602 is silicon nitride. In this way, with reference to FIG. 9 and FIG. 10, etching may be performed according to a certain selectivity ratio, so as to only remove the second portion 602 and the portion of the semiconductor channel 01 covered with the second portion 602, so that a groove 61 is formed in the middle portion of the semiconductor channel 01. FIG. 11 is a top view of a single semiconductor channel 01. As shown in FIG. 11, the groove 61 extends in the second direction Y and penetrates through the semiconductor channel 01.

Figure 9:
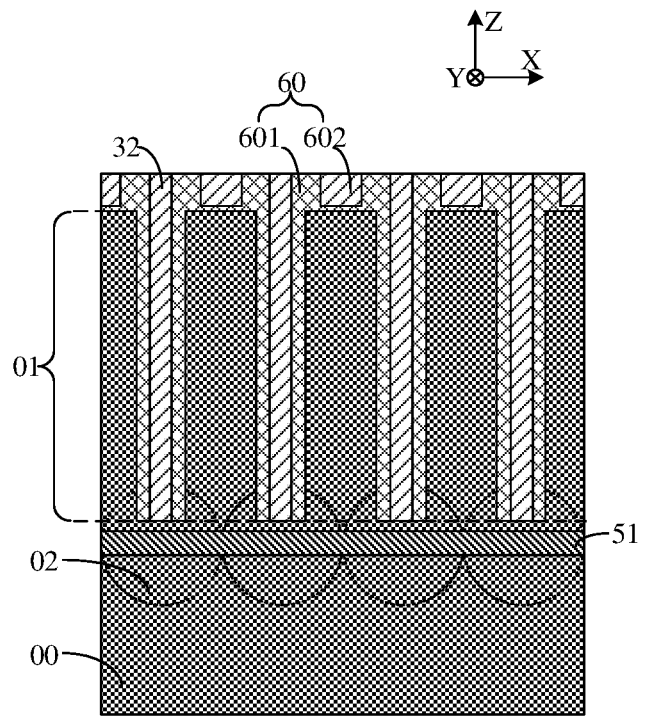
FIG. 9 is a second schematic diagram of a method for manufacturing a semiconductor structure according to an embodiment of the present disclosure.

In the embodiments of the present disclosure, with reference to FIG. 9, before the groove is formed by etching, a first isolation layer 32 may be deposited. The first isolation layer 32 extends in the second direction Y to isolate two adjacent semiconductor channels 01 from each other. The material of the first isolation layer 32 may be silicon nitride.

Figure 10:
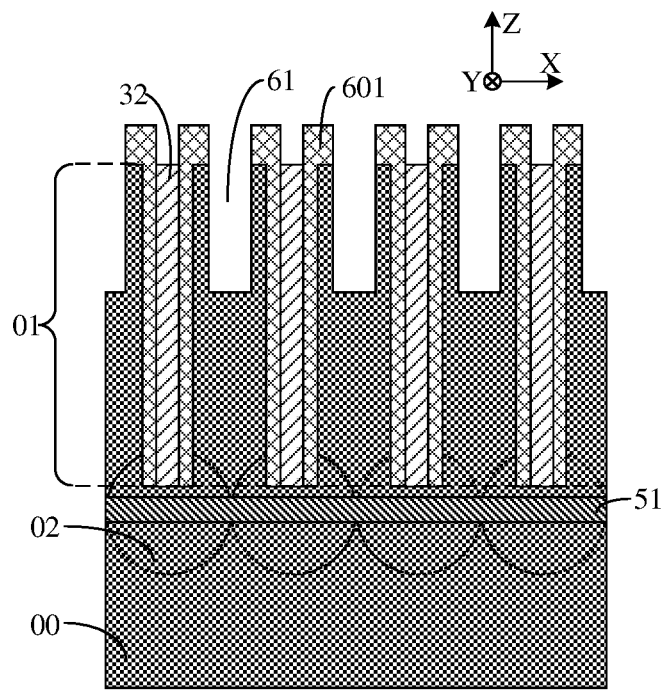
FIG. 10 is a third schematic diagram of a method for manufacturing a semiconductor structure according to an embodiment of the present disclosure.
Figure 11:
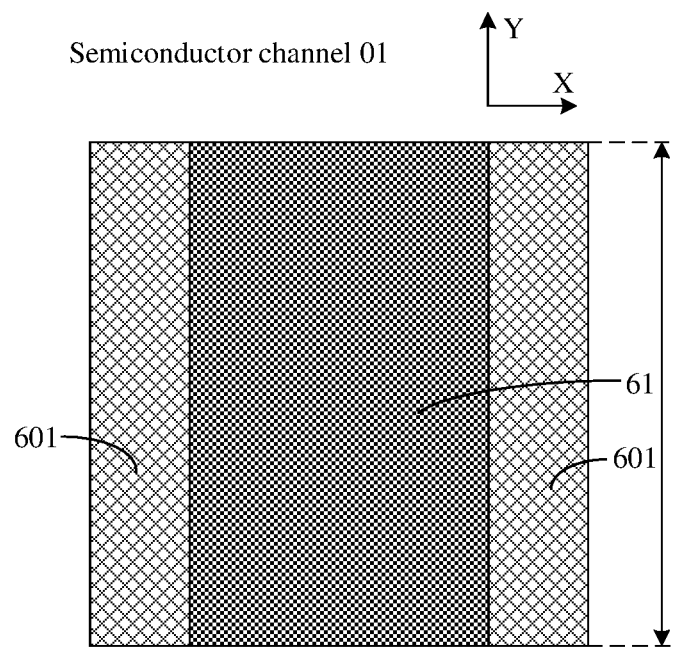
FIG. 11 is a fourth schematic diagram of a method for manufacturing a semiconductor structure according to an embodiment of the present disclosure.
Figure 12:
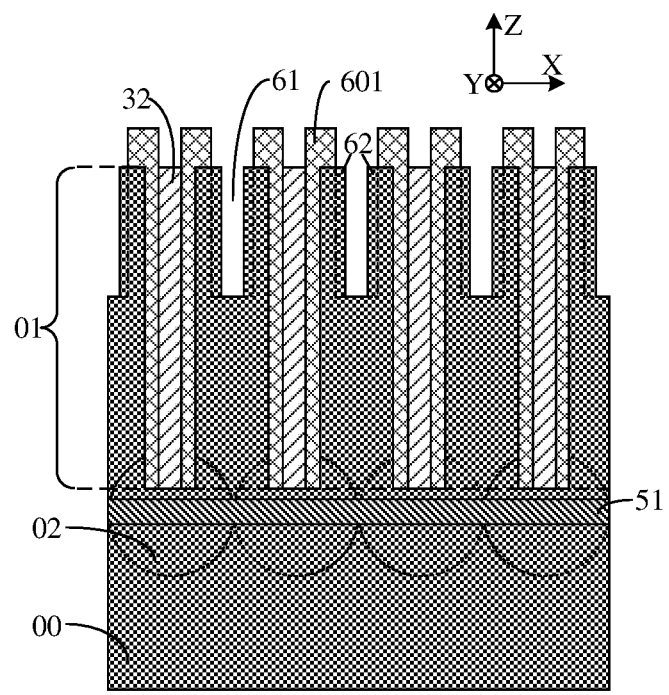
FIG. 12 is a fifth schematic diagram of a method for manufacturing a semiconductor structure according to an embodiment of the present disclosure.

In the embodiments of the present disclosure, with reference to FIG. 10 and FIG. 12, after the groove 61 is formed by etching, an epitaxial layer 62 may be formed in the inner wall of the groove 61 to reduce the width of the groove 61, and repair the defects of the inner wall of the groove 61.

Figure 13:
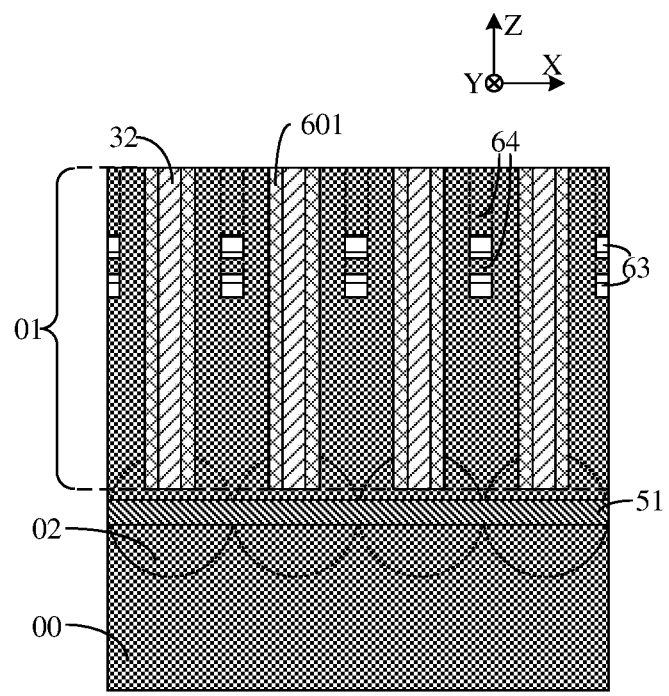
FIG. 13 is a sixth schematic diagram of a method for manufacturing a semiconductor structure according to an embodiment of the present disclosure.

In the embodiments of the present disclosure, with reference to FIG. 12 and FIG. 13, after the groove 61 is formed, a second sacrificial layer 63 may be formed in the groove 61. The material of the second sacrificial layer 63 may be silicon germanium (SiGe), which is easily removed in the subsequent process, and provides a basis for forming the bridge structure in the second gate structure in the subsequent process.

Figure 14:
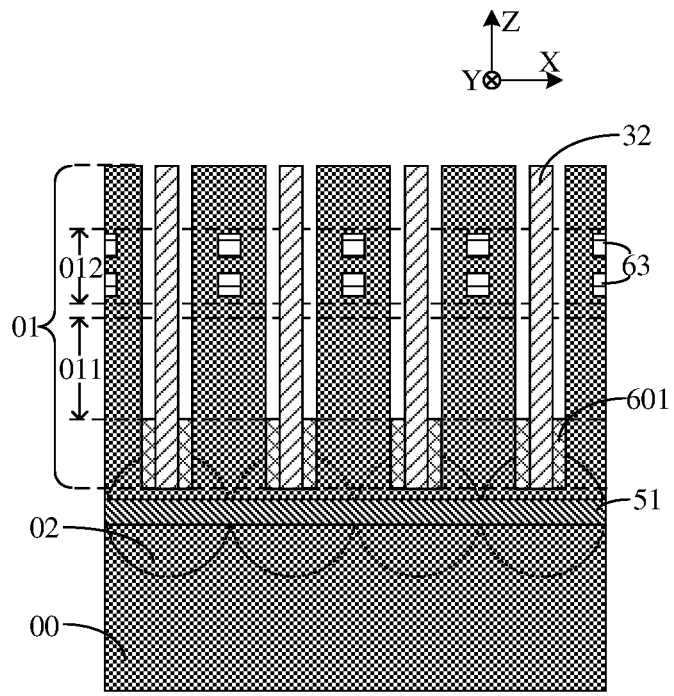
FIG. 14 is a seventh schematic diagram of a method for manufacturing a semiconductor structure according to an embodiment of the present disclosure.

In the embodiments of the present disclosure, with reference to FIG. 9 and FIG. 14, the first portion 601 of the mask layer 60 covering the sidewall of the semiconductor channel 01 may be etched to the bottom portion of the first area 011 of the semiconductor channel 01. As shown in FIG. 14, in this way, the sidewall of the semiconductor channel 01 close to the bottom portion of the semiconductor channel 01 may be protected to prevent short circuit from occurring.

In S102, a first gate structure is formed in the first area of each of the plurality of semiconductor channels.

Figure 15:
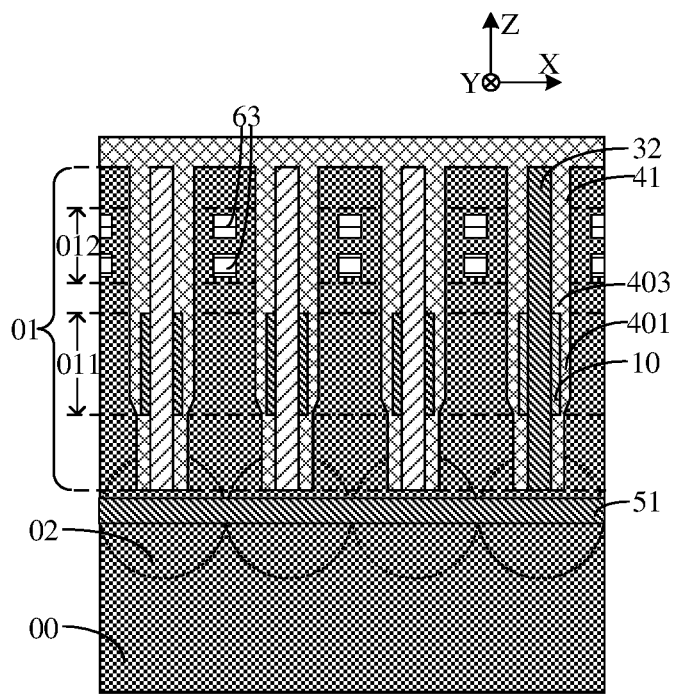
FIG. 15 is an eighth schematic diagram of a method for manufacturing a semiconductor structure according to an embodiment of the present disclosure.

In the embodiments of the present disclosure, with reference to FIG. 15, a first initial dielectric layer 41 may be deposited on the sidewall of the semiconductor channel 01 through a Chemical Vapor Deposition (CVD) process. The portion of the first initial dielectric layer 41 arranged in the first area 011 forms a first portion 401 of a dielectric layer. The material of the first initial dielectric layer 41 may be silicon oxide.

In the embodiments of the present disclosure, with reference to FIG. 15, after the first initial dielectric layer 41 is formed, a first gate layer arranged around the sidewall of the first initial dielectric layer 41 may be deposited. The material of the first gate layer may be a conductive material, such as titanium nitride. Then, the deposited first gate layer may be etched back to the top portion of the first area 011, and the remaining portion of the first gate layer forms the first gate structure 10 shown in FIG. 15. The first gate structure 10 is arranged around the respective semiconductor channel 01, and the first portion 401 of the dielectric layer is arranged between the first gate structure 10 and the respective semiconductor channel 01.

In S103, a second gate structure is formed in the second area of each of the plurality of semiconductor channels.

Figure 16:
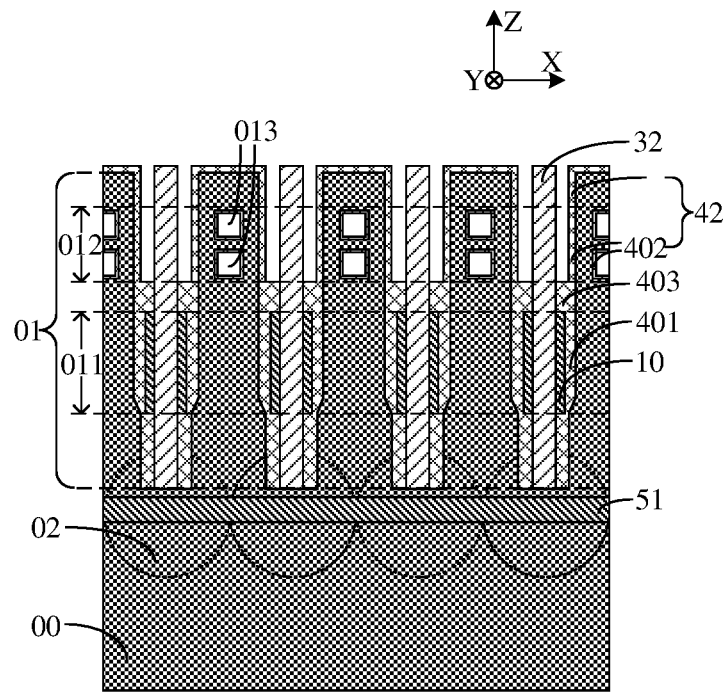
FIG. 16 is a ninth schematic diagram of a method for manufacturing a semiconductor structure according to an embodiment of the present disclosure.
Figure 17:
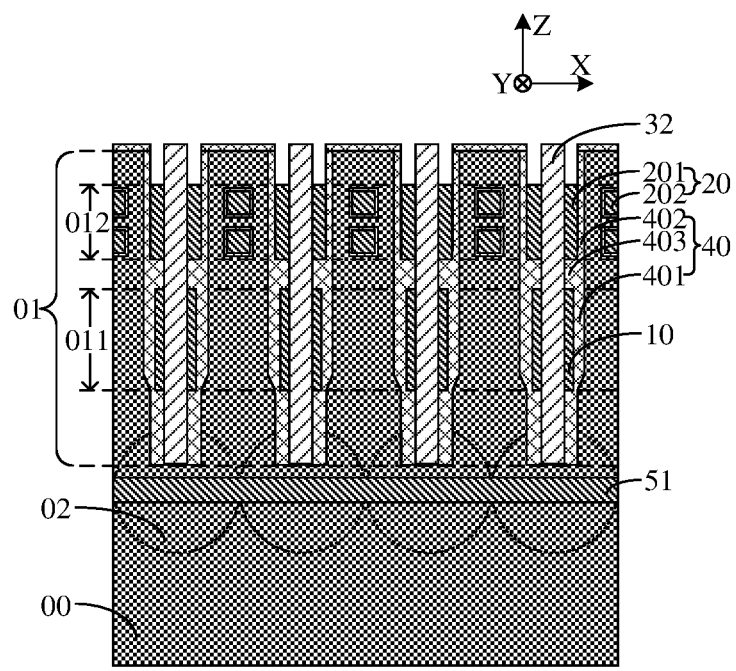
FIG. 17 is a tenth schematic diagram of a method for manufacturing a semiconductor structure according to an embodiment of the present disclosure.

In the embodiments of the present disclosure, with reference to FIG. 16 and FIG. 17, after the second initial dielectric layer 42 is formed, the second gate layer arranged around the sidewall of the second initial dielectric layer 42 and filling a through hole 013 is formed. The portion of the second gate layer filling the through hole 013 forms a bridge structure 202, and the material of the second gate layer may be a conductive material, such as titanium nitride. Then, the portion of the second gate layer arranged around the sidewall of the second initial dielectric layer 42 may be etched back to the top portion of the second area 012, and the remaining portion of the second gate layer forms a ring structure 201. Thus, as shown in FIG. 17, the formed second gate structure 20 includes the ring structure 201 and at least one bridge structure 202. The ring structure 201 is arranged around a respective semiconductor channel 01, and the at least one bridge structure 202 penetrates through a respective semiconductor channel 01 and extends to an inner wall of the ring structure 201 in a penetrating direction. The second portion 402 of the dielectric layer 40 is arranged between the second gate structure 20 and the respective semiconductor channel 01.

It can be understood that, the semiconductor channel 01 and the first gate structure 10 may form a first transistor, and the semiconductor channel 01 and the second gate structure 20 may form a second transistor. A gate of the first transistor and a gate of the second transistor may both receive a control signal, so that the number of the controlled structures is increased. Meanwhile, the second gate structure 20 includes the ring structure 201 arranged around the semiconductor channel 01 and the bridge structure 202 penetrating through the semiconductor channel 01, so that the area of the semiconductor channel 01 covered by the second gate structure 20 is enlarged, and the control capability of the gate of the second transistor is improved, thereby reducing the leakage of the transistors. Thus, a semiconductor structure with higher electrical performance is formed.

In S104, a covering layer is formed.

Figure 18:
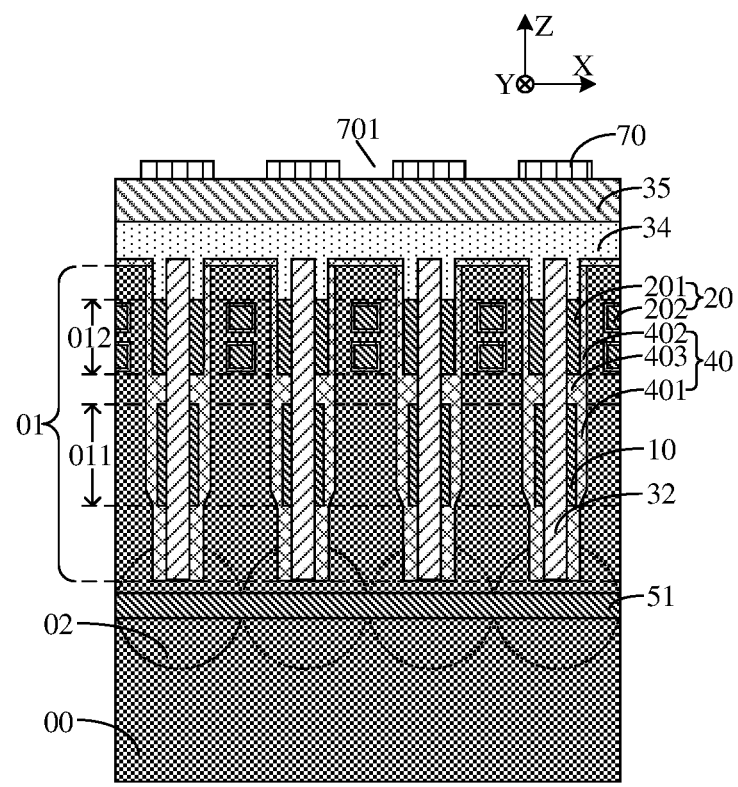
FIG. 18 is an eleventh schematic diagram of a method for manufacturing a semiconductor structure according to an embodiment of the present disclosure.

In the embodiments of the present disclosure, with reference to FIG. 18, after the second gate structure 20 is formed, an initial covering layer 34 may be deposited. The initial covering layer 34 covers the semiconductor channels 01 and the ring structures 201. The material of the initial covering layer 34 has a higher etching rate than the general materials.

Figure 19:
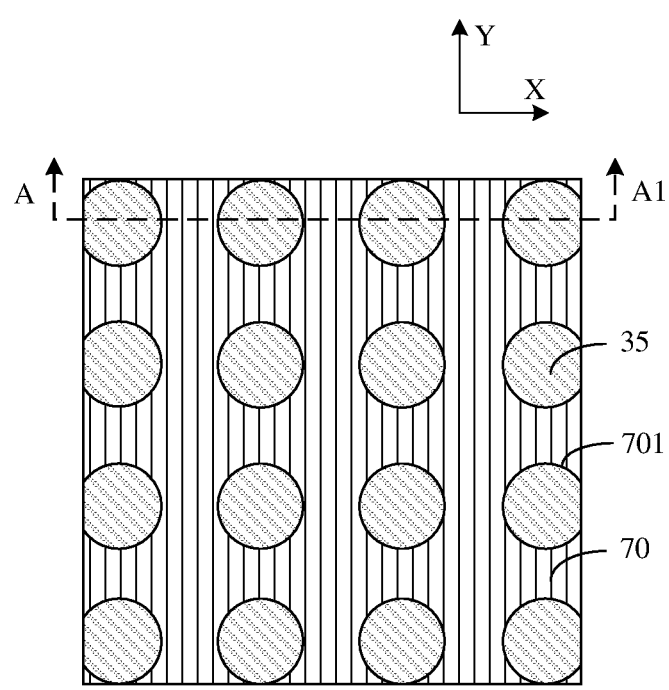
FIG. 19 is a twelfth schematic diagram of a method for manufacturing a semiconductor structure according to an embodiment of the present disclosure.

In the embodiments of the present disclosure, with reference to FIG. 18, after the initial covering layer 34 is formed, a first sacrificial layer 35 may be deposited on the initial covering layer 34, and a patterned first mask 70 is formed on the first sacrificial layer 35. The first mask 70 includes a plurality of second interconnecting holes 701. Each second interconnecting hole 701 corresponds to a respective semiconductor channel 01. With reference to FIG. 18 and FIG. 19, FIG. 19 is a top view, and FIG. 18 is a cross-sectional view taken along a cross-sectional line A-A1 in FIG. 19. The second interconnecting holes 701 are distributed on the first mask 70, and the position of each second interconnecting hole 701 corresponds to the position of a respective one of the semiconductor channels 01. That is, each second interconnecting hole 701 is arranged directly above a respective one of the semiconductor channels 01.

Figure 20:
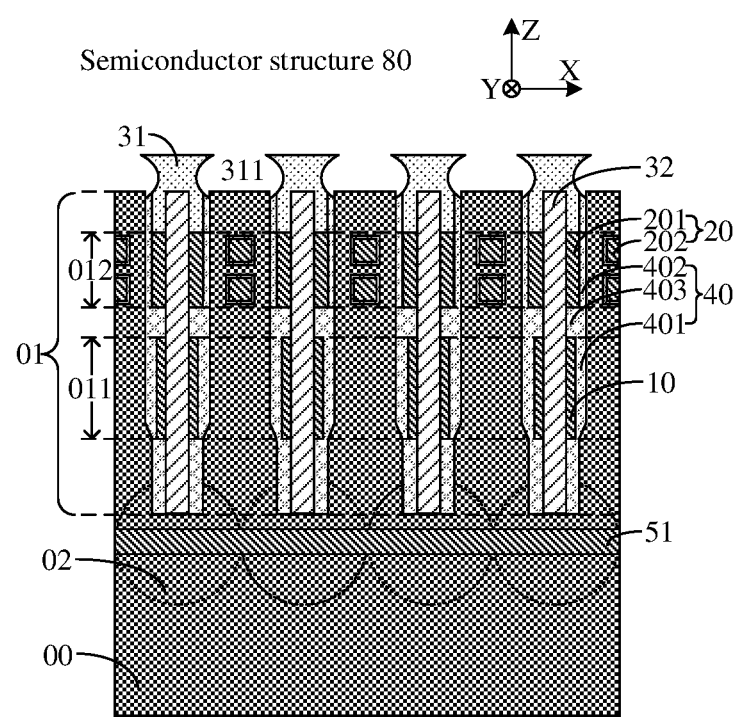
FIG. 20 is a thirteenth schematic diagram of a method for manufacturing a semiconductor structure according to an embodiment of the present disclosure.

In the embodiments of the present disclosure, with reference to FIG. 18 to FIG. 20, etching may be performed according to the second interconnecting holes 701 on the first mask 70 to expose the top portion of each semiconductor channel 01. The first sacrificial layer 35 is removed, and the first interconnecting holes 311 are formed in the initial covering layer 34 to form the covering layer 31. As shown in FIG. 20, the covering layer 31 is arranged in a spaced area between any two adjacent semiconductor channels 01. The covering layer 31 includes a plurality of first interconnecting holes 311 extending in the vertical direction Z. Each first interconnecting hole 311 exposes a top portion of a respective semiconductor channel 01 and a portion of a sidewall of the respective semiconductor channel close to the top portion of the respective semiconductor channel.

It can be understood that, since the material of the initial covering layer 34 has a higher etching rate than the general materials, after the initial covering layer 34 is etched, the first interconnecting hole 311 with a larger aperture of the middle portion of the first interconnecting hole is more easily formed, and the top portion of the semiconductor channel 01 and a portion of the sidewall of the semiconductor channel close to the top portion of the semiconductor channel are exposed, as shown in FIG. 20. Thus, for the capacitor formed in the first interconnecting hole 311, the surface area of the electrode plate of the capacitor is larger, and the capacitance is greater. Meanwhile, the contact area between the capacitor and the semiconductor channel 01 is larger, and the contact resistance is smaller.

In the embodiments of the present disclosure, the material of the initial covering layer 34 may be boron silicon nitride ($SiB_xN_y$), where a ratio of x to y represents a ratio of the number of boron atoms to the number of nitrogen atoms in the boron silicon nitride, and $4 \geq y > x > 0$, $y-x \leq 2$. In some embodiments of the present disclosure, the boron silicon nitride $SiB_xN_y$ may be $SiB_2N_4$ or $SiB_{2.6}N_4$. It should be noted that the representation of $SiB_xN_y$ does not mean that the number of the silicon atoms is 1. Compared with the general materials, the etching rate of the boron silicon nitride is higher, that is, the boron silicon nitride is easier to be etched. In this embodiment, the initial covering layer 34 may be etched through dry etching.

In the embodiments of the present disclosure, when the silicon nitride is formed, the boron element may be introduced into the cavity, thereby forming the boron silicon nitride, that is, forming the initial covering layer 34. Meanwhile, by controlling a flow ratio of the nitrogen atoms to the boron atoms, the ratio of the number of the boron atoms to the number of the nitrogen atoms in the boron silicon nitride may be adjusted. It should be noted that, since the boron silicon nitride is easier to be etched than silicon nitride, the boron atoms are doped into the silicon nitride at the same time, so that the stress of the silicon nitride may be reduced. That is, the stress of the boron silicon nitride is smaller, and the internal interaction force of the boron silicon nitride is smaller, so that the structural damage is not prone to generation, thereby improving the performance of the device. In a case that the difference between the number of the nitrogen atoms and the number of the boron atoms is smaller than or equal to 2, the content of the nitrogen atoms in the boron silicon nitride may be increased, so that the etching rate of the boron silicon nitride can be increased, and the stress of the boron silicon nitride is smaller.

In some embodiments of the present disclosure, with reference to FIG. 14 and FIG. 15, the operation that the first gate structure 10 is formed includes S201 to S204, which may be described in combination with various operations.

In S201, a portion of a sidewall of each semiconductor channel 01 is etched, so that each of a width of the first area 011 and a width of the second area 012 is less than a width of a bottom portion of each semiconductor channel 01.

In the embodiments of the present disclosure, before the first portion 401 of the dielectric layer is formed, a portion of the sidewall of the semiconductor channel 01 in FIG. 14 (i.e. the portion of the sidewall above the bottom portion of the first area 011) may be etched (for example, through dry etching), so that each of the width of the first area 011 and the width of the second area 012 is less than the width of the bottom portion of the semiconductor channel 01, thereby providing a larger space for the subsequent formation of the first gate structure and even the second gate structure. The above width may be a width along the first direction X.

In S202, a first initial dielectric layer 41 is formed on the sidewall of each semiconductor channel 01.

In the embodiments of the present disclosure, the first initial dielectric layer 41 may be deposited on the sidewall of the semiconductor channel 01 in FIG. 14 through a CVD process. A portion of the first initial dielectric layer 41 in the first area 011 forms a first portion 401 of a dielectric layer, and the first portion 401 of the dielectric layer is arranged between the first gate structure 10 and the respective semiconductor channel 01.

In S203, a first gate layer arranged around a sidewall of the first initial dielectric layer is formed.

In the embodiments of the present disclosure, after the first initial dielectric layer 41 is formed, the first gate layer arranged around the sidewall of the first initial dielectric layer 41 may be deposited. The material of the first gate layer may be a conductive material, such as titanium nitride.

In 204, the first gate layer is etched to form a first gate structure 10.

In the embodiments of the present disclosure, the deposited first gate layer may be etched back to the top portion of the first area 011, and the remaining portion of the first gate layer forms the first gate structure 10 shown in FIG. 15.

With reference to FIG. 15, after the first gate structure 10 is formed, a third portion 403 of the dielectric layer may be deposited on the first gate structure 10. The third portion 403 of the dielectric layer is configured to isolate the first gate structure 10 from a second gate structure to be formed. The material of the third portion 403 of the dielectric layer may be silicon oxide.

In some embodiments of the present disclosure, with reference to FIG. 9 to FIG. 13, the operation that the second gate structure 20 is formed includes S301 to S303, which may be described in combination with various operations.

In S301, a groove 61 is formed in each semiconductor channel 01.

In the embodiments of the present disclosure, as shown in FIG. 9 and FIG. 10, the middle portion of the first portion 601 is filled with the second portion 602 of the mask layer 60, and etching is performed according to the mask layer 60 to form the groove 61 in the middle portion of the semiconductor channel 01. FIG. 11 is a top view of a single semiconductor channel 01. As shown in FIG. 11, the groove 61 extends in the second direction Y, and penetrates through the semiconductor channel 01.

In the embodiments of the present disclosure, with reference to FIG. 9, the first isolation layer 32 may also be deposited before the groove 61 is formed by etching. The first isolation layer 32 extends in the second direction Y to isolate two adjacent semiconductor channels 01 from each other. The material of the first isolation layer 32 may be silicon nitride.

In the embodiments of the present disclosure, with reference to FIG. 12, after the groove 61 is formed by etching, an epitaxial layer 62 may be formed on the inner wall of the groove 61 to reduce the width of the groove 61. It can be understood that, the smaller the size of the mask pattern is, the greater the difficulty of the process is. Thus, etching is firstly performed according to the wider second portion 602 of the mask layer 60, and then the epitaxial layer 62 is formed to reduce the width of the groove 61. In this way, a small-size groove is formed with a large-size mask pattern, which reduces the difficulty of the process.

Meanwhile, in the process of forming the groove 61 by etching, defects and damages may be brought to the inner wall of the groove 61. The epitaxial layer 62 may also repair the defects and damages on the inner wall of the groove 61, thereby reducing the defects of the semiconductor channels 01, and improving the performance of the formed semiconductor structure.

In S302, a second sacrificial layer 63 is formed in the groove 61.

In the embodiments of the present disclosure, with reference to FIG. 12 and FIG. 13, after the groove 61 is formed, a second sacrificial layer 63 may be formed in the groove 61. The material of the second sacrificial layer 63 may be silicon germanium (SiGe), which is easily removed in the subsequent process.

In S303, a filling layer 64 is formed in the groove. The filling layer 64 is arranged on the second sacrificial layer 63.

In the embodiments of the present disclosure, if the second gate structure to be formed only includes one bridge structure, the remaining portion of the groove 61 is directly and completely filled with the filling layer 64 formed on the second sacrificial layer 63. If the second gate structure to be formed includes at least two bridge structures, after one filling layer 64 is formed on one second sacrificial layer 63, another second sacrificial layer 63 and another filling layer 64 are sequentially formed in the groove 61, and finally the top portion of the groove 61 is filled with said another filling layer 64. As shown in FIG. 12 and FIG. 13, two second sacrificial layers 63 and two filling layers 64 are formed in the groove 61. The second sacrificial layers 63 and the filling layers 64 are alternately stacked on one another, and finally the top portion of the groove 61 is filled with the filling layer 64. It can be understood that, the second sacrificial layers 63 and the filling layers 64 are sequentially formed in the groove 61, which provides a basis for forming the bridge structures in the second gate structure in the subsequent process.

In the embodiments of the present disclosure, with reference to FIG. 15 to FIG. 17, the operation that the second gate structure 20 is formed includes S304 to S307, which will be described in combination with various operations.

In S304, each second sacrificial layer 63 is removed to form a through hole 013. The through hole 013 penetrates through a respective semiconductor channel 01.

In the embodiment of the present disclosure, with reference to FIG. 15 and FIG. 16, the first initial dielectric layer 41 in FIG. 15 may be firstly etched to the bottom portion of the second area 012. Then, the second sacrificial layer 63 filled in the semiconductor channel 01 is removed through a wet etching process, so as to form the through hole 013 shown in FIG. 16.

In S305, a second initial dielectric layer 42 is formed on a sidewall of each semiconductor channel 01 and on an inner wall of the through hole 013.

In the embodiments of the present disclosure, with reference to FIG. 16, the second initial dielectric layer 42 may be formed on the sidewall of the semiconductor channel 01 and on the inner wall of the through hole 013 through a thermal oxidation process. A portion of the second initial dielectric layer 42 arranged in the second area 012 forms the second portion 402 of the dielectric layer 40.

In S306, a second gate layer arranged around a sidewall of the second initial dielectric layer 42 and filling the through hole 013 is formed.

In the embodiments of the present disclosure, with reference to FIG. 16 and FIG. 17, after the second initial dielectric layer 42 is formed, the second gate layer arranged around the sidewall of the second initial dielectric layer 42 and filling the through hole 013 may be formed. A portion of the second gate layer filling the through hole 013 forms each bridge structure 202. The material of the second gate layer may be a conductive material, such as titanium nitride.

In S307, a portion of the second gate layer arranged around the sidewall of the second initial dielectric layer 42 is etched to form the ring structure 201.

In the embodiments of the present disclosure, with reference to FIG. 16 and FIG. 17, the portion of the second gate layer arranged around the sidewall of the second initial dielectric layer 42 may be etched back to the top portion of the second area 012, and the remaining portion of the second gate layer forms the ring structure 201.

In some embodiments of the present disclosure, with reference to FIG. 18 to FIG. 20, the operation that the covering layer 31 is formed includes S401 to S404, which will be described in combination with various operations.

In S401, an initial covering layer is deposited.

In the embodiments of the present disclosure, with reference to FIG. 18, after the second gate structure 20 is formed, the initial covering layer 34 may be deposited. The initial covering layer 34 covers the semiconductor channels 01 and the ring structures 201. The material of the initial covering layer 34 has a higher etching rate than the general materials.

In the embodiments of the present disclosure, the material of the initial covering layer 34 may be boron silicon nitride ($SiB_xN_y$), where a ratio of x to y represents a ratio of the number of boron atoms to the number of nitrogen atoms in the boron silicon nitride, and $4 \geq y > x > 0$, $y-x \leq 2$. In some embodiments of the present disclosure, the boron silicon nitride $SiB_xN_y$ may be $SiB_2N_4$ or $SiB_{2.6}N_4$. It should be noted that the representation of $SiB_xN_y$ does not mean that the number of the silicon atoms is 1. Compared with the general materials, the etching rate of the boron silicon nitride is higher, that is, the boron silicon nitride is easier to be etched.

In the embodiments of the present disclosure, when the silicon nitride is formed, the boron element may be introduced into the cavity, thereby forming the boron silicon nitride, that is, forming the initial covering layer 34. Meanwhile, by controlling a flow ratio of the nitrogen atoms to the boron atoms, the ratio of the number of the boron atoms to the number of the nitrogen atoms in the boron silicon nitride may be adjusted. It should be noted that, since the boron silicon nitride is easier to be etched than silicon nitride, the boron atoms are doped into the silicon nitride at the same time, so that the stress of the silicon nitride may be reduced. That is, the stress of the boron silicon nitride is smaller, and the internal interaction force of the boron silicon nitride is smaller, so that the structural damage is not prone to generation, thereby improving the performance of the device. In a case that the difference between the number of the nitrogen atoms and the number of the boron atoms is smaller than or equal to 2, the content of the nitrogen atoms in the boron silicon nitride may be increased, so that the etching rate of the boron silicon nitride can be increased, and the stress of the boron silicon nitride is smaller.

In S402, a first sacrificial layer is deposited on the initial covering layer.

In the embodiments of the present disclosure, with reference to FIG. 18, after the initial covering layer 34 is formed, the first sacrificial layer 35 may be deposited on the initial covering layer 34. The first sacrificial layer 35 is configured to play a blocking and protecting role during subsequent etching.

In S403, a patterned first mask is formed on the first sacrificial layer.

In the embodiments of the present disclosure, with reference to FIG. 18, after the first sacrificial layer 35 is formed, the patterned first mask 70 may be formed on the first sacrificial layer 35. The first mask 70 includes a plurality of second interconnecting holes 701. Each second interconnecting hole 701 corresponds to a respective semiconductor channel 01. With reference to FIG. 18 and FIG. 19, FIG. 19 is a top view, and FIG. 18 is a cross-sectional view taken along the cross-sectional line A-A1 in FIG. 19. The second interconnecting holes 701 are distributed on the first mask 70, and the position of each second interconnecting hole 701 corresponds to the position of a respective one of the semiconductor channels 01. That is, each second interconnecting hole 701 is arranged directly above a respective one of the semiconductor channels 01.

In S404, etching is performed according to the second interconnecting holes to expose the top portion of each semiconductor channel, and the first interconnecting holes are formed in the initial covering layer to form the covering layer.

In the embodiments of the present disclosure, with reference to FIG. 18 to FIG. 20, etching may be performed according to the second interconnecting holes 701 on the first mask 70 to expose the top portion of each semiconductor channel 01. The first sacrificial layer 35 is removed, and the first interconnecting holes 311 are formed in the initial covering layer 34 to form the covering layer 31. As shown in FIG. 20, the covering layer 31 is arranged in a spaced area between any two adjacent semiconductor channels 01. The covering layer 31 includes a plurality of first interconnecting holes 311 extending in the vertical direction Z. Each first interconnecting hole 311 exposes a top portion of a respective semiconductor channel 01 and a portion of the sidewall of the respective semiconductor channel close to the top portion of the respective semiconductor channel.

It can be understood that, since the material of the initial covering layer 34 has a higher etching rate than the general materials, after the initial covering layer 34 is etched, the first interconnecting hole 311 with a larger aperture of the middle portion of the first interconnecting hole is more easily formed, and the top portion of the semiconductor channel 01 and a portion of the sidewall of the semiconductor channel close to the top portion of the semiconductor channel are exposed, as shown in FIG. 20. Thus, for the capacitor formed in the first interconnecting hole 311, the surface area of the electrode plate of the capacitor is larger, and the capacitance is greater. Meanwhile, the contact area between the capacitor and the semiconductor channel 01 is larger, and the contact resistance is smaller.

As can be seen, the embodiments of the present disclosure provide a semiconductor structure and a method for manufacturing a semiconductor structure. The semiconductor structure includes a substrate, a plurality of first gate structures, a plurality of second gate structures, and a covering layer. The substrate includes a plurality of semiconductor channels spaced apart from each other, arranged at a top portion of the substrate and extending in a vertical direction. Each of the plurality of first gate structures is arranged in a first area of a respective one of the plurality of semiconductor channels and is arranged around the respective one of the plurality of semiconductor channels. Each of the plurality of second gate structures is arranged in a second area of a respective one of the plurality of semiconductor channels and includes a ring structure and at least one bridge structure. The ring structure is arranged around the respective one of the plurality of semiconductor channels, and the at least one bridge structure penetrates through the respective one of the plurality of semiconductor channels and extends to an inner wall of the ring structure in a penetrating direction. The covering layer is arranged in a spaced area between any two adjacent semiconductor channels of the plurality of semiconductor channels. The covering layer includes a plurality of first interconnecting holes extending in the vertical direction. Each of the plurality of first interconnecting holes exposes a top portion of a respective one of the plurality of semiconductor channels and a portion of a sidewall of the respective one of the plurality of semiconductor channels close to the top portion of the respective one of the plurality of semiconductor channels. In this way, the semiconductor channel and the first gate structure may form a first transistor, the semiconductor channel and the second gate structure may form a second transistor, and a capacitor may be formed in each first interconnecting hole. A gate of the first transistor and a gate of the second transistor may both receive a control signal, so that the number of the controlled structures is increased. The second gate structure includes the ring structure arranged around the semiconductor channel and the bridge structure penetrating through the semiconductor channel, so that the area of the semiconductor channel covered by the second gate structure is enlarged, and the control capability of the gate of the second transistor is improved. The first interconnecting hole exposes the top portion of the semiconductor channel and a portion of the sidewall of the semiconductor channel close to the top portion of the semiconductor channel, so that the contact area between the capacitor and the semiconductor channel is enlarged, and the contact resistance is reduced. Thus, the embodiments of the present disclosure improve the overall electrical performance of the semiconductor structure It should be noted that in the present disclosure, terms "include" "comprise" or any other variants thereof are intended to cover non-exclusive inclusion, so that a process, a method, an article or a device including a series of elements not only includes those elements, but also includes those that are not explicitly listed, or also include elements inherent to the process, the method, the article, or the device. In the case that there are no more limitations, an element defined by the phrase "including a/an" does not exclude the existence of the other same elements in the process, the method, the article, or the device that includes the element.

The sequence numbers of the embodiments of the present disclosure are merely for the description, and do not represent the advantages and disadvantages of the embodiments. The methods disclosed in the several method embodiments provided in the present disclosure may be combined arbitrarily without conflicts, so as to obtain new method embodiments. The features disclosed in the several product embodiments provided in the present disclosure may be combined arbitrarily without conflicts, so as to obtain new product embodiments. The features disclosed in several method or device embodiments provided in the present disclosure may be combined arbitrarily without conflicts, so as to obtain new method embodiments or device embodiments.

The above are only specific embodiments of the present disclosure, but the protection scope of the present disclosure is not limited thereto. Any skilled in the art, within the technical scope disclosed by the present disclosure, may easily think of variations or replacements, which should be covered within the protection scope of the present disclosure. Therefore, the protection scope of the present disclosure should be subjected to the protection scope of the claims.

The invention claimed is:

1. A semiconductor structure, comprising:
 a substrate, wherein the substrate comprises a plurality of semiconductor channels spaced apart from each other, the plurality of semiconductor channels are arranged at a top portion of the substrate and extend in a vertical direction, and each of the plurality of semiconductor channels comprises a first area and a second area;
 a plurality of first gate structures, wherein each of the plurality of first gate structures is arranged in the first area of a respective one of the plurality of semiconductor channels and is-arranged around the respective one of the plurality of semiconductor channels;
 a plurality of second gate structures, wherein each of the plurality of second gate structures is arranged in the second area of a respective one of the plurality of semiconductor channels and comprises a ring structure and at least one bridge structure, wherein the ring structure is arranged around the respective one of the plurality of semiconductor channels, and the at least one bridge structure penetrates through the respective one of the plurality of semiconductor channels and extends to an inner wall of the ring structure in a penetrating direction; and
 a covering layer arranged in a spaced area between any two adjacent semiconductor channels of the plurality of semiconductor channels and comprising a plurality of first interconnecting holes extending in the vertical direction, wherein each of the plurality of first interconnecting holes exposes a top portion of a respective one of the plurality of semiconductor channels and a portion of a sidewall of the respective one of the plurality of semiconductor channels close to the top portion of the respective one of the plurality of semiconductor channels.

2. The semiconductor structure according to claim 1, wherein an aperture of a middle portion of each of the plurality of first interconnecting holes is larger than an aperture of a top portion or a bottom portion of each of the plurality of first interconnecting holes.

3. The semiconductor structure according to claim 1, wherein a top portion of the covering layer is higher than the top portion of each of the plurality of semiconductor channels.

4. The semiconductor structure according to claim 1, wherein a material of the covering layer is boron silicon nitride $SiB_xN_y$, wherein y minus x is less than or equal to 2.

5. The semiconductor structure according to claim 1, wherein the second area is arranged above the first area, a top portion of the ring structure is lower than a top portion of the respective one of the plurality of semiconductor channels, and the top portion of the ring structure is covered with the covering layer.

6. The semiconductor structure according to claim 1, further comprising a plurality of dielectric layers, wherein each of the plurality of dielectric layers comprises a first portion, a second portion, and a third portion, and
   wherein the first portion of each of the plurality of dielectric layers is arranged between a respective one of the plurality of first gate structures and a respective one of the plurality of semiconductor channels;
   the second portion of each of the plurality of dielectric layers is arranged between a respective one of the plurality of second gate structures and a respective one of the plurality of semiconductor channels;
   the third portion of each of the plurality of dielectric layers is arranged between the first portion of a respective one of the plurality of dielectric layers and the second portion of the respective one of the plurality of dielectric layers; and
   a thickness of the third portion of each of the plurality of dielectric layers is greater than a thickness of the first portion of each of the plurality of dielectric layers, and the thickness of the first portion of each of the plurality of dielectric layers is greater than a thickness of the second portion of each of the plurality of dielectric layers.

7. The semiconductor structure according to claim 1, wherein each of the plurality of second gate structures comprises at least two bridge structures stacked on one another in the vertical direction.

8. The semiconductor structure according to claim 1, wherein a width of the at least one bridge structure is less than a width of each of the plurality of semiconductor channels.

9. The semiconductor structure according to claim 1, wherein a length of each of the plurality of first gate structures in the vertical direction is greater than a length of the ring structure in the vertical direction; and
   a thickness of the ring structure is greater than a thickness of each of the plurality of first gate structures.

10. A method for manufacturing a semiconductor structure, comprising:
   providing a substrate, wherein the substrate comprises a plurality of semiconductor channels spaced apart from each other, the plurality of semiconductor channels are arranged at a top portion of the substrate and extend in a vertical direction, and each of the plurality of semiconductor channels comprises a first area and a second area;
   forming a first gate structure in the first area of each of the plurality of semiconductor channels, wherein the first gate structure is arranged around a respective one of the plurality of semiconductor channels;
   forming a second gate structure in the second area of each of the plurality of semiconductor channels, wherein the second gate structure comprises a ring structure and at least one bridge structure, wherein the ring structure is arranged around a respective one of the plurality of semiconductor channels, and the at least one bridge structure penetrates through the respective one of the plurality of semiconductor channels and extends to an inner wall of the ring structure in a penetrating direction; and
   forming a covering layer, wherein the covering layer is arranged in a spaced area between any two adjacent semiconductor channels of the plurality of semiconductor channels, and comprises a plurality of first interconnecting holes extending in the vertical direction, wherein each of the plurality of first interconnecting holes exposes a top portion of a respective one of the plurality of semiconductor channels and a portion of a sidewall of the respective one of the plurality of semiconductor channels close to the top portion of the respective one of the plurality of semiconductor channels.

11. The method for manufacturing the semiconductor structure according to claim 10, wherein forming the covering layer comprises:
   depositing an initial covering layer;
   depositing a first sacrificial layer on the initial covering layer;
   forming a patterned first mask on the first sacrificial layer, wherein the first mask comprises a plurality of second interconnecting holes, and each of the plurality of second interconnecting holes corresponds to a respective one of the plurality of semiconductor channels; and
   performing etching according to the plurality of second interconnecting holes to expose a top portion of each of the plurality of semiconductor channels, and to form the plurality of first interconnecting holes in the initial covering layer to form the covering layer.

12. The method for manufacturing the semiconductor structure according to claim 10, wherein forming the first gate structure comprises:
   etching a portion of a sidewall of each of the plurality of semiconductor channels to allow each of a width of the first area and a width of the second area to be less than a width of a bottom portion of each of the plurality of semiconductor channels;
   forming a first initial dielectric layer on the sidewall of each of the plurality of semiconductor channels, wherein a portion of the first initial dielectric layer in the first area forms a first portion of a dielectric layer, and the first portion of the dielectric layer is arranged between the first gate structure and the respective one of the plurality of semiconductor channels;
   forming a first gate layer arranged around a sidewall of the first initial dielectric layer; and
   etching the first gate layer to form the first gate structure.

13. The method for manufacturing the semiconductor structure according to claim 10, wherein in a case that the second gate structure comprises one bridge structure, forming the second gate structure comprises:
- forming a groove in each of the plurality of semiconductor channels;
- forming a second sacrificial layer in the groove; and
- forming a filling layer in the groove, wherein the filling layer is arranged on the second sacrificial layer, and a remaining portion of the groove is completely filled with the filling layer.

14. The method for manufacturing the semiconductor structure according to claim 10, wherein in a case that the second gate structure comprises at least two bridge structures, forming the second gate structure comprises:
- forming a groove in each of the plurality of semiconductor channels;
- forming one of at least two second sacrificial layers in the groove;
- forming a filling layer in the groove, wherein the filling layer is arranged on said one of at least two second sacrificial layers; and
- sequentially forming another one of the at least two second sacrificial layers as well as another filling layer in the groove, and filling up to a top portion of the groove with said another filling layer.

15. The method for manufacturing the semiconductor structure according to claim 13, wherein forming the second gate structure further comprises:
- removing each second sacrificial layer to form a through hole, wherein the through hole penetrates through a respective one of the plurality of semiconductor channels;
- forming a second initial dielectric layer on a sidewall of the second area of each of the plurality of semiconductor channels and on an inner wall of the through hole, wherein a portion of the second initial dielectric layer arranged on the second area forms a second portion of a dielectric layer, and the second portion of the dielectric layer is arranged between the second gate structure and a respective one of the plurality of semiconductor channels;
- forming a second gate layer arranged around a sidewall of the second initial dielectric layer and filling the through hole, wherein a portion of the second gate layer filling the through hole forms each bridge structure; and
- etching a portion of the second gate layer arranged around the sidewall of the second initial dielectric layer to form the ring structure.

16. The method for manufacturing the semiconductor structure according to claim 14, wherein forming the second gate structure further comprises:
- removing each second sacrificial layer to form a through hole, wherein the through hole penetrates through a respective one of the plurality of semiconductor channels;
- forming a second initial dielectric layer on a sidewall of the second area of each of the plurality of semiconductor channels and on an inner wall of the through hole, wherein a portion of the second initial dielectric layer arranged on the second area forms a second portion of a dielectric layer, and the second portion of the dielectric layer is arranged between the second gate structure and a respective one of the plurality of semiconductor channels;
- forming a second gate layer arranged around a sidewall of the second initial dielectric layer and filling the through hole, wherein a portion of the second gate layer filling the through hole forms each bridge structure; and
etching a portion of the second gate layer arranged around the sidewall of the second initial dielectric layer to form the ring structure.

* * * * *